US012805363B2

(12) United States Patent
Lim

(10) Patent No.: US 12,805,363 B2
(45) Date of Patent: Nov. 17, 2026

(54) SEMICONDUCTOR SUBSTRATE AND METHOD OF MANUFACTURING THE SEMICONDUCTOR SUBSTRATE

(71) Applicant: SAMSUNG ELECTRONICS CO., LTD., Suwon-si (KR)

(72) Inventor: Jihyun Lim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 275 days.

(21) Appl. No.: 18/639,081

(22) Filed: Apr. 18, 2024

(65) Prior Publication Data

US 2024/0413068 A1 Dec. 12, 2024

(30) Foreign Application Priority Data

Jun. 7, 2023 (KR) ........................ 10-2023-0072682

(51) Int. Cl.
*H10B 80/00* (2026.01)
*H10W 70/05* (2026.01)
(Continued)

(52) U.S. Cl.
CPC ......... *H10W 70/685* (2026.01); *H10W 70/05* (2026.01); *H10W 70/093* (2026.01);
(Continued)

(58) Field of Classification Search
CPC .... H10B 80/00; H10W 70/05; H10W 70/093; H10W 70/635; H10W 70/65;
(Continued)

(56) References Cited

U.S. PATENT DOCUMENTS 9,565,774 B2 2/2017 Lee
2016/0095215 A1 3/2016 Furutani
(Continued)

FOREIGN PATENT DOCUMENTS

CN 113725148 11/2021
KR 10-203932 7/1999
(Continued)

*Primary Examiner* — Timothy J Thompson
*Assistant Examiner* — Guillermo J Egoavil
(74) *Attorney, Agent, or Firm* — Morgan, Lewis & Bockius LLP

(57) ABSTRACT

A semiconductor substrate includes: a plurality of first pad patterns; a first insulating layer covering side surfaces of the plurality of first pad patterns, and having first openings that expose at least portions of the plurality of first pad patterns; a plurality of redistribution wirings provided on the first insulating layer, and electrically connected to the plurality of first pad patterns through the first openings of the first insulating layer; a second insulating layer covering the plurality of redistribution wirings, and having second openings that expose at least portions of the plurality of redistribution wirings; a plurality of second pad patterns provided on the second insulating layer, and electrically connected to the plurality of redistribution wirings through the second openings of the second insulating layer; and a plurality of heat transfer patterns provided on the plurality of first pad patterns and not covered by the first insulating layer.

19 Claims, 19 Drawing Sheets

(51) Int. Cl.
*H10W 70/65* (2026.01)
*H10W 70/685* (2026.01)
*H10W 90/00* (2026.01)

(52) U.S. Cl.
CPC ......... *H10W 70/65* (2026.01); *H10W 90/701* (2026.01); *H10B 80/00* (2023.02); *H10W 90/00* (2026.01); *H10W 90/724* (2026.01)

(58) Field of Classification Search
CPC ... H10W 70/685; H10W 72/20; H10W 72/90; H10W 90/00; H10W 90/701; H10W 90/724
USPC .......................................................... 174/252
See application file for complete search history.

(56) References Cited

U.S. PATENT DOCUMENTS

| | | | |
|---|---|---|---|
| 2016/0360609 A1 | 12/2016 | Lee | |
| 2019/0393143 A1 | 12/2019 | Rosch et al. | |
| 2021/0267043 A1* | 8/2021 | Yoo | G03B 17/55 |
| 2022/0068780 A1 | 3/2022 | Kang et al. | |
| 2022/0223435 A1 | 7/2022 | Lee | |
| 2022/0328467 A1* | 10/2022 | Chen | H10W 90/00 |

FOREIGN PATENT DOCUMENTS

| | | |
|---|---|---|
| KR | 10-2009-0072226 | 7/2009 |
| KR | 10-1585554 | 1/2016 |
| KR | 10-2120785 | 6/2020 |
| KR | 10-2281458 | 7/2021 |

* cited by examiner

SEMICONDUCTOR SUBSTRATE AND METHOD OF MANUFACTURING THE SEMICONDUCTOR SUBSTRATE

CROSS-REFERENCE TO RELATED APPLICATION

This application claims priority under 35 U.S.C. § 119 to Korean Patent Application No. 10-2023-0072682, filed on Jun. 7, 2023 in the Korean Intellectual Property Office (KIPO), the disclosure of which is incorporated by reference in their entirety.

TECHNICAL FIELD

Example embodiments of the present inventive concept relate to a semiconductor substrate and a method of manufacturing the semiconductor substrate. More particularly, example embodiments of the present inventive concept relate to a semiconductor substrate on which a plurality of semiconductor chips is mounted and a method of manufacturing the same.

DISCUSSION OF THE RELATED ART

A semiconductor substrate may electrically connect a plurality of semiconductor devices to each other through redistribution wirings, substrate pads, etc. formed in the semiconductor substrate. As the plurality of semiconductor devices become faster and have higher capacities, heat generated from the redistribution wirings and the substrate pads of the semiconductor substrates may increase. As sizes of the semiconductor devices increases, occurrence of a warpage phenomenon in a semiconductor substrate may increase. To prevent heat generation, warpage phenomenon, and the like, a method of increasing thicknesses of the substrate pads or the redistribution wirings of the semiconductor substrate may be used.

SUMMARY

According to example embodiments of the present inventive concept, a semiconductor substrate includes: a plurality of first pad patterns; a first insulating layer having a first surface and a second surface opposite to each other, wherein the first insulating layer covers side surfaces of the plurality of first pad patterns such that lower surfaces of the first pad patterns are exposed by the second surface of the first insulating layer, wherein the first insulating layer has first openings that expose at least portions of upper surfaces of the plurality of first pad patterns; a plurality of redistribution wirings provided on the first surface of the first insulating layer, wherein the plurality of redistribution wirings are electrically connected to the plurality of first pad patterns through the first openings of the first insulating layer; a second insulating layer covering the plurality of redistribution wirings, wherein the second insulating layer has second openings that expose at least portions of the plurality of redistribution wirings; a plurality of second pad patterns provided on the second insulating layer, wherein the plurality of second pad patterns are electrically connected to the plurality of redistribution wirings through the second openings of the second insulating layer; and a plurality of heat transfer patterns provided on the plurality of first pad patterns and not covered by the first insulating layer.

According to example embodiments of the present inventive concept, a semiconductor substrate includes: a plurality of first pad patterns; a first insulating layer covering the plurality of first pad patterns, wherein the first insulating layer has first openings that expose at least portions of upper surfaces of the plurality of first pad patterns; a plurality of redistribution wirings provided on an upper surface of the first insulating layer, wherein the plurality of redistribution wirings are electrically connected to the plurality of first pad patterns through the first openings of the first insulating layer; a second insulating layer provided on the first insulating layer, wherein the second insulating layer covers the plurality of redistribution wirings, wherein the second insulating layer has second openings that expose at least portions of the plurality of redistribution wirings; a plurality of second pad patterns provided on the second insulating layer, wherein the plurality of second pad patterns are electrically connected to the plurality of redistribution wirings through the second openings of the second insulating layer; a plurality of first heat transfer patterns provided on the plurality of first pad patterns; and a plurality of second heat transfer patterns provided on the plurality of second pad pattern.

According to example embodiments of the present inventive concept, a method of manufacturing a semiconductor substrate includes: providing a semi-substrate having a seed layer and temporary pad patterns that are formed on the seed layer; forming a photoresist pattern on the seed layer, wherein the photoresist pattern has temporary openings that expose regions of the temporary pad patterns; forming a plurality of heat transfer patterns on the seed layer and in the temporary openings of the photoresist pattern; and removing at least a portion of the seed layer that is exposed by the temporary pad patterns to form first pad patterns on the heat transfer patterns.

According to example embodiments of the present inventive concept, a semiconductor substrate includes: a plurality of first pad patterns; a first insulating layer having a first surface and a second surface opposite to each other, wherein the first insulating layer covers side surfaces of the plurality of first pad patterns such that lower surfaces of the plurality of first pad patterns are exposed from the second surface of the first insulating layer, wherein the first insulating layer has first openings that expose at least portions of upper surfaces of the plurality of first pad patterns; a plurality of redistribution wirings provided on the first surface of the first insulating layer, wherein the plurality of redistribution wirings are electrically connected to the first pad patterns through the first openings of the first insulating layer; a second insulating layer covering the plurality of redistribution wirings and having second openings that expose at least portions of the plurality of redistribution wirings; a plurality of second pad patterns provided on the second insulating layer, wherein the plurality of second pad patterns are electrically connected to the plurality of redistribution wirings through the second openings of the second insulating layer; a plurality of heat transfer patterns provided on the lower surfaces of the plurality of first pad patterns and protruding beyond the second surface of the first insulating layer; a third insulating layer provided on the second surface of the first insulating layer and having third openings that expose at least portions of the heat transfer patterns; a plurality of second redistribution wirings provided on the third insulating layer and electrically connected to the heat transfer patterns through the third openings of the third insulating layer; a first protective layer provided on the second insulating layer and exposing at least portions of the second pad patterns; and a second protective layer provided on the third insulating layer.

BRIEF DESCRIPTION OF THE DRAWINGS

The above and other features of the present inventive concept will become more apparent by describing in detail example embodiments thereof, with reference to the accompanying drawings, in which.

DETAILED DESCRIPTION OF EMBODIMENTS

Hereinafter, example embodiments of the present inventive concept will be explained in detail with reference to the accompanying drawings.

Figure 1:
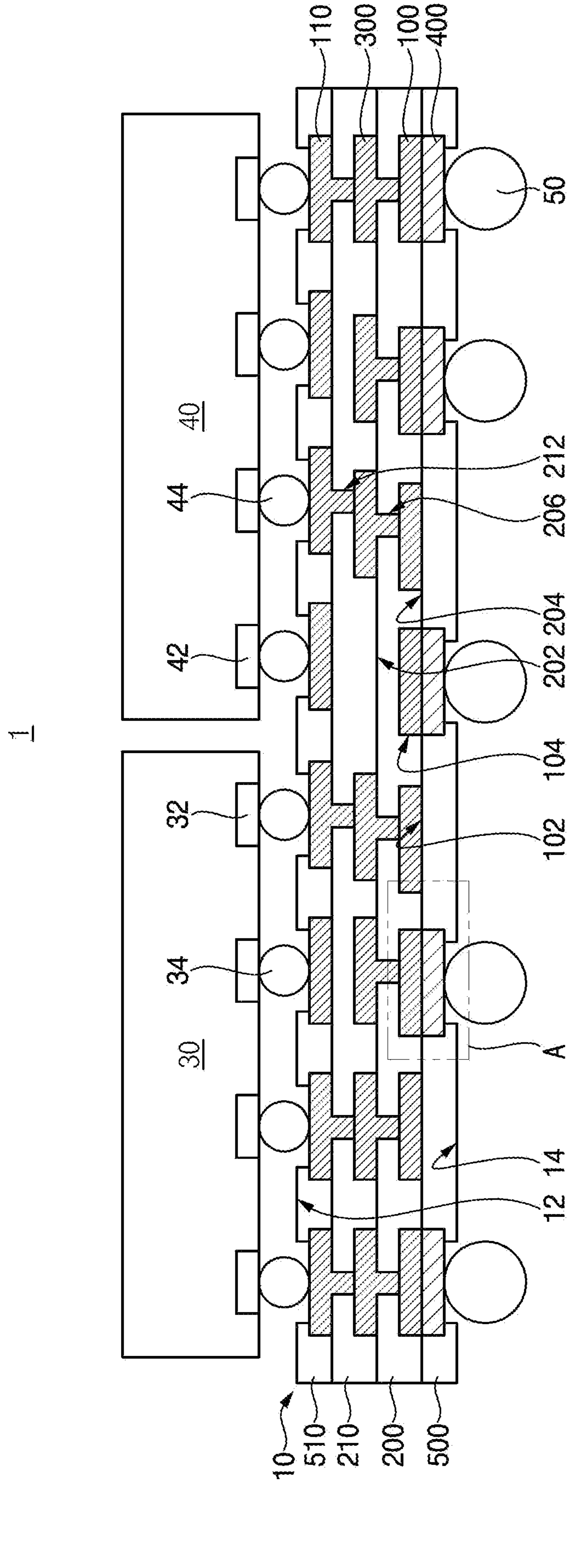
FIG. 1 is a cross-sectional view illustrating a semiconductor substrate of a semiconductor package in accordance with example embodiments of the present inventive concept.
Figure 2:
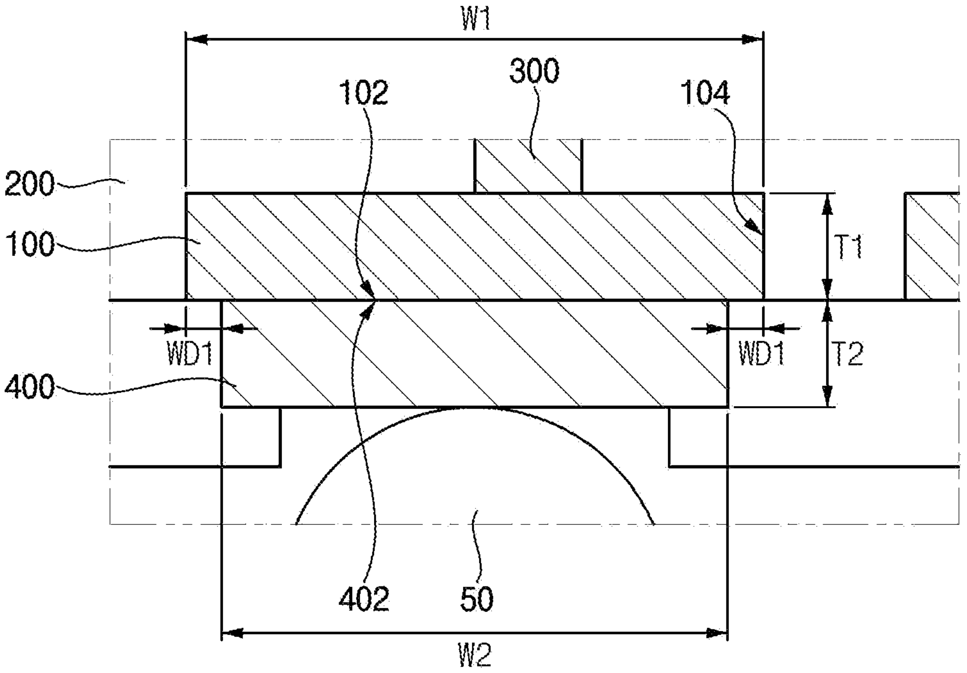
FIG. 2 is an enlarged cross-sectional view illustrating portion 'A' in FIG. 1.

FIG. 1 is a cross-sectional view illustrating a semiconductor substrate of a semiconductor package in accordance with example embodiments of the present inventive concept. FIG. 2 is an enlarged cross-sectional view illustrating portion 'A' in FIG. 1.

Referring to FIGS. 1 and 2, a semiconductor package 1 may include a semiconductor substrate 10, and first and second semiconductor devices 30 and 40 disposed on the semiconductor substrate 10. The first and second semiconductor devices 30 and 40 are spaced apart from each other.

In example embodiments of the present inventive concept, the semiconductor package 1 may be referred to as a memory device having a stacked chip structure in which a plurality of dies (chips) are stacked. For example, the semiconductor package 1 may include a semiconductor memory device having a 2.5D chip structure. In this case, the first semiconductor device 30 may include a logic semiconductor device, and the second semiconductor device 40 may include a memory device. The logic semiconductor device may be an ASIC as a host such as a CPU, GPU, or SoC. The memory device may include a high bandwidth memory (HBM) device, a dynamic random access memory (DRAM), and the like. In addition, the semiconductor package 1 may include a semiconductor memory device having a 3D chip structure.

The first and second semiconductor devices 30 and 40 may be spaced apart from each other on the semiconductor substrate 10. A planar area of each of the first and second semiconductor devices 30 and 40 may be smaller than a planar area of the semiconductor substrate 10. When viewed from a plan view, the first and second semiconductor devices 30 and 40 may be disposed within a region of the semiconductor substrate 10.

Hereinafter, the semiconductor substrate 10 will be described in detail.

In example embodiments of the present inventive concept, the semiconductor substrate 10 may include an upper surface 12 and a lower surface 14 opposite to the upper surface 12. The first and second semiconductor devices 30 and 40 may be arranged on the upper surface 12 of the semiconductor substrate 10, and the semiconductor substrate 10 may electrically connect the first and second semiconductor devices 30 and 40 to each other. For example, the semiconductor substrate 10 may include a printed circuit board (PCB). The semiconductor substrate 10 may include an embedded trace substrate (ETS). The printed circuit board may be a multilayer circuit board having vias and various circuits therein.

The first and second semiconductor devices 30 and 40 may be connected to each other through wirings inside the semiconductor substrate 10. The first semiconductor device 30 may include a first conductive bump 34 formed on a first chip pad 32. The first chip pad 32 may be provided on a lower surface of the first semiconductor device 30. The second semiconductor device 40 may include a second conductive bump 44 formed on a second chip pad 42. The second chip pad 42 may be provided on a lower surface of the second semiconductor device 40. The first and second semiconductor devices 30 and 40 may be mounted on the semiconductor substrate 10, and may be electrically connected to each other via the first and second conductive bumps 34 and 44. The semiconductor substrate 10 may provide a high-density interconnection between the first and second semiconductor devices 30 and 40.

In example embodiments of the present inventive concept, the semiconductor substrate 10 may include a plurality of first pad patterns 100, a first insulating layer 200, a plurality of redistribution wirings 300, a second insulating layer 210, a plurality of second pad patterns 110, and a plurality of heat transfer patterns 400. The first insulating layer 200 may cover the plurality of first pad patterns 100. The plurality of redistribution wirings 300 may be provided on the first insulating layer 200 and may be electrically connected to the plurality of first pad patterns 100. The second insulating layer 210 may be provided on the first insulating layer 200 to cover the plurality of redistribution wirings 300. The plurality of second pad patterns 110 may be provided on the second insulating layer 210 and may be electrically connected to the plurality of redistribution wirings 300, and a plurality of heat transfer patterns 400 may be respectively provided on the first pad patterns 100.

The first insulating layer 200 may have a first surface 202 and a second surface 204 opposite to the first surface 202. The first insulating layer 200 may cover the plurality of first pad patterns 100. The first insulating layer 200 may cover side surfaces 104 of the plurality of first pad patterns 100 such that lower surfaces 102 of the plurality of first pad patterns 100 are exposed from the second surface 204 of the first insulating layer 200. The first insulating layer 200 may have first openings 206 that expose at least portions of upper surfaces of the first pad patterns 100.

The plurality of first pad patterns 100 may be provided in the first insulating layer 200. The upper surfaces of the first pad patterns 100 may be exposed through the first openings 206 from an upper surface of the first insulating layer 200, that is, the first surface 202. The lower surfaces of the first pad patterns 100 may be exposed from the lower surface of the first insulating layer 200, that is, the second surface 204.

At least one of the first pad patterns 100 may be electrically connected to the plurality of redistribution wirings 300.

In addition, at least one of the first pad patterns 100 may be electrically insulated from the plurality of redistribution wirings 300. The electrically insulated first pad patterns 100 may absorb heat that is generated inside the first insulating layer 200, and may dissipate the heat to the outside.

Each of the first pad patterns 100 may have a first width W1. Each of the first pad patterns 100 may have a first thickness T1. For example, the first width W1 may be within a range of about 8 μm to about 20 μm. The first thickness T1 may be within a range of about 10 μm to about 20 μm.

The plurality of redistribution wirings 300 may be provided on the first insulating layer 200, and may be electrically connected to the first pad patterns 100 through the first openings 206. The plurality of redistribution wirings 300 may be electrically connected to some of the first pad patterns 100. The plurality of redistribution wirings 300 may electrically connect the first and second semiconductor devices 30 and 40 to each other.

The second insulating layer 210 may cover the plurality of redistribution wirings 300 that are disposed on the first insulating layer 200. The second insulating layer 210 may be provided on the first insulating layer 200, and may have second openings 212 that expose the plurality of redistribution wirings 300.

The second pad patterns 110 may be provided on the second insulating layer 210, and may be electrically connected to the plurality of redistribution wirings 300 through the second openings 212. Thus, the plurality of second pad patterns 110 may be exposed from the upper surface 12 of the semiconductor substrate 10. The second pad patterns 110 may be electrically connected to the first and second conductive bumps 34 and 44 to be electrically connected to the first and second semiconductor devices 30 and 40.

The plurality of heat transfer patterns 400 may be provided on at least portions of the first pad patterns 100. The plurality of heat transfer patterns 400 may be provided on the first pad patterns 100 and may protrude beyond the second surface 204 of the first insulating layer 200. The plurality of heat transfer patterns 400 may receive heat from the first pad patterns 100. Since the plurality of heat transfer patterns 400 are provided to protrude from the first insulating layer 200, the heat may be efficiently dissipated from the first pad patterns 100.

An amount of the heat (calorific value) generated from the first pad patterns 100 and the plurality of heat transfer patterns 400 may be defined by Equation (1) below.

$$W = Ri^2t = i^3\frac{t}{s} \qquad \text{Equation (1)}$$

Here, W is a calorific value, R is resistance, i is current, t is time, and s is a cross-sectional area of a conductor.

Since the plurality of heat transfer patterns 400 are provided on the first pad patterns 100 to increase the cross-sectional area of the conductor, the amount of heat generated inside the semiconductor substrate 10 may be reduced.

Upper surfaces 402 of the plurality of heat transfer patterns 400 may be bonded to the lower surfaces 102 of the first pad patterns 100, respectively. The plurality of heat transfer patterns 400 may be electrically connected to the first pad patterns 100. The heat transfer patterns 400 may transmit data signals, ground signals, and power signals to the first pad patterns 100. The heat transfer patterns 400 may receive data signals, ground signals, and power signals from the first pad patterns 100.

At least one of the heat transfer patterns 400 may be electrically connected to the plurality of redistribution wirings 300 through the first pad pattern 100. The heat transfer patterns 400, which are provided on the first pad patterns 100 that are electrically insulated from the plurality of redistribution wirings 300, may be electrically insulated.

Each of the heat transfer patterns 400 may have a second width W2. Each of the heat transfer patterns 400 may have a second thickness T2. For example, the second width W2 may be within a range of about 4 μm to about 16 μm. The second thickness T2 may be within a range of about 10 μm to about 20 μm.

The second width W2 of the heat transfer patterns 400 may be smaller than the first width W1 of the first pad pattern 100. Because the second width W2 is smaller than the first width W1, alignment errors between the first pad patterns 100 and the heat transfer patterns 400 may be reduced during the process of forming the semiconductor substrate 10. For example, a difference WD1 between the first width W1 and the second width W2 may be within a range of about 3 μm to about 5 μm.

For example, the heat transfer patterns 400 may include a signal pattern, a land pattern, a ball pattern, and a dummy pattern. Shapes and types of the heat transfer patterns 400 may have all shapes that are capable of dissipating the heat. Structures of the heat transfer patterns 400 may vary without limitation depending on function, type, size, etc. of the first pad patterns 100. When the heat transfer patterns 400 include the dummy pattern, the heat transfer patterns 400 may serve as heat sinks.

For example, each of the first pad patterns 100, the second pad patterns 110, the redistribution wirings 300, and the heat transfer patterns 400 may include copper (Cu), aluminum (Al), tungsten (W), nickel (Ni), molybdenum (Mo), gold (Au), silver (Ag), chromium (Cr), tin (Sn), titanium (Ti), and an alloy thereof.

In example embodiments of the present inventive concept, the semiconductor substrate 10 may be connected to other semiconductor devices via external connection bumps 50, which may be conductive connection members. The external connection bumps 50 may be provided on the heat transfer patterns 400. For example, the external connection bumps 50 may include C4 bumps.

In example embodiments of the present inventive concept, the semiconductor substrate 10 may further include a first protective layer 500 that is provided on the first insulating layer 200, and a second protective layer 510 that is provided on the second insulating layer 210. The first protective layer 500 may be provided on the second surface 204 of the first insulating layer 200 and may expose at least portions of the heat transfer patterns 400. The second protective layer 510 may be provided on the second insulating layer 210 and may expose at least portions of the second pad patterns 110.

The first and second protective layers 500 and 510 may include an insulating material to protect the semiconductor substrate 10 from external elements and impurities. The first and second protective layers 500 and 510 may include, for example, an oxide layer or a nitride layer. For example, the first and second protective layers 500 and 510 may include a double layer of an oxide layer and a nitride layer. The first and second passivation layers 500 and 510 may include an oxide layer, for example, a silicon oxide film ($SiO_2$) using a high-density plasma chemical vapor deposition (HDP-CVD) process.

As describe above, the heat transfer patterns 400 may contact and be electrically connected to the plurality of first pad patterns 100. The heat transfer patterns 400 may share an electrical signal moving through the first pad patterns 100, and the heat transfer patterns 400 may reduce an electrical load of the first pad patterns 100. The heat transfer patterns 400 may contact the first pad patterns 100 to increase the cross-sectional area of the electrical movement passage. Since the heat transfer patterns 400 increase the cross-sectional area, the amount of the heat of the semiconductor substrate 10 may be reduced. Since the heat transfer patterns 400 may be provided to protrude from the second surface 204 of the first insulating layer 200, the heat transfer patterns 400 may receive the heat from the first pad patterns 100 and may efficiently dissipate the heat to the outside.

Further, the heat transfer patterns 400 may be bonded to the first pad patterns 100 to support the first pad patterns 100. Since the heat transfer patterns 400 support the first pad patterns 100, an internal supporting force of the semiconductor substrate 10 may be increased and a warpage phenomenon may be prevented.

Hereinafter, a method of manufacturing the semiconductor package in FIG. 1 will be described.

Figure 7:
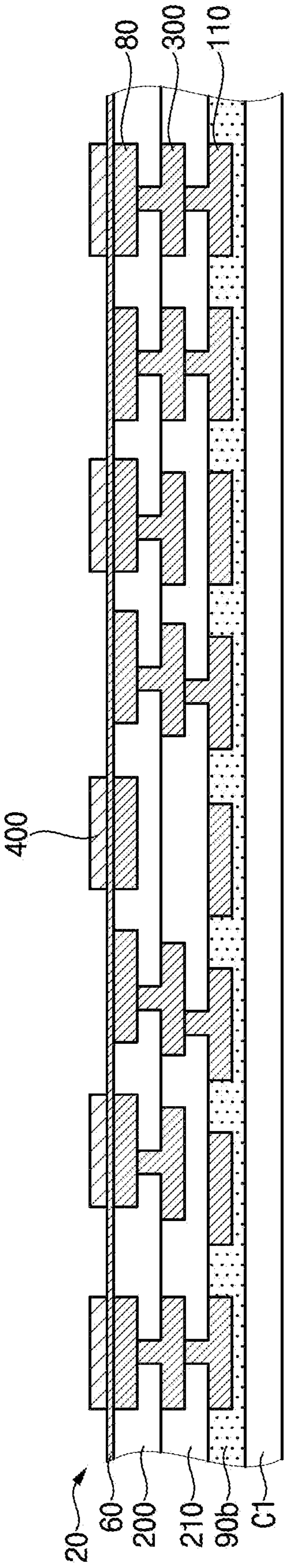
Figure 8:
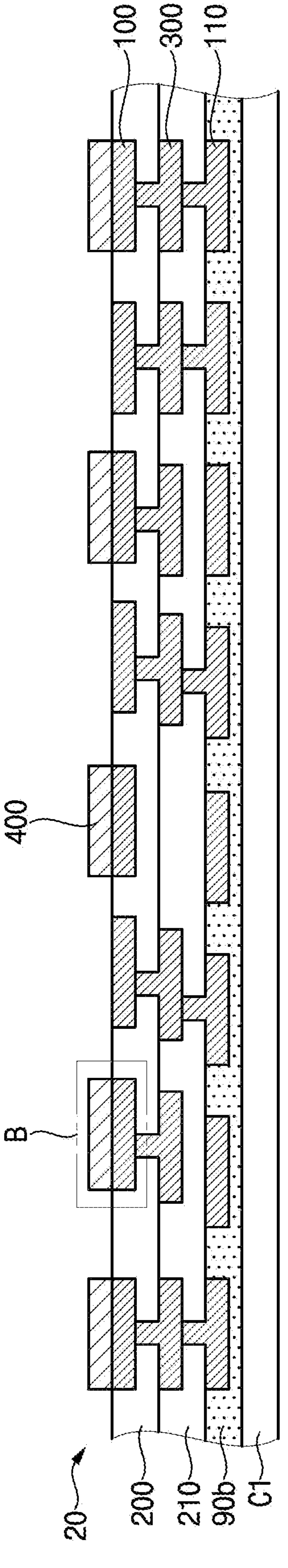
Figure 9:
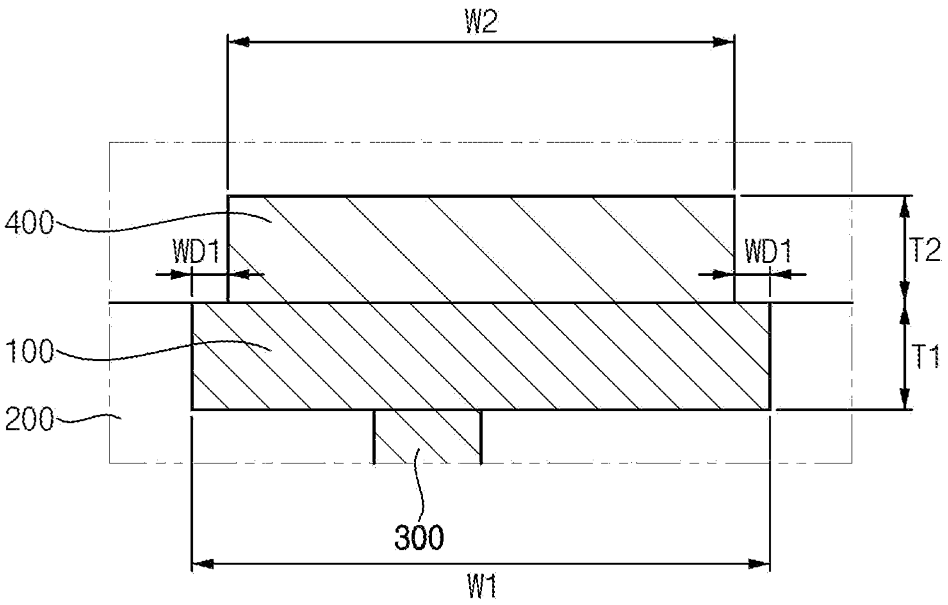

FIGS. 3 to 11 are cross-sectional views illustrating a method of manufacturing a semiconductor package having a semiconductor substrate in accordance with example embodiments of the present inventive concept. FIG. 9 is an enlarged cross-sectional view illustrating portion ‘B’ in FIG. 8.

Figure 3:
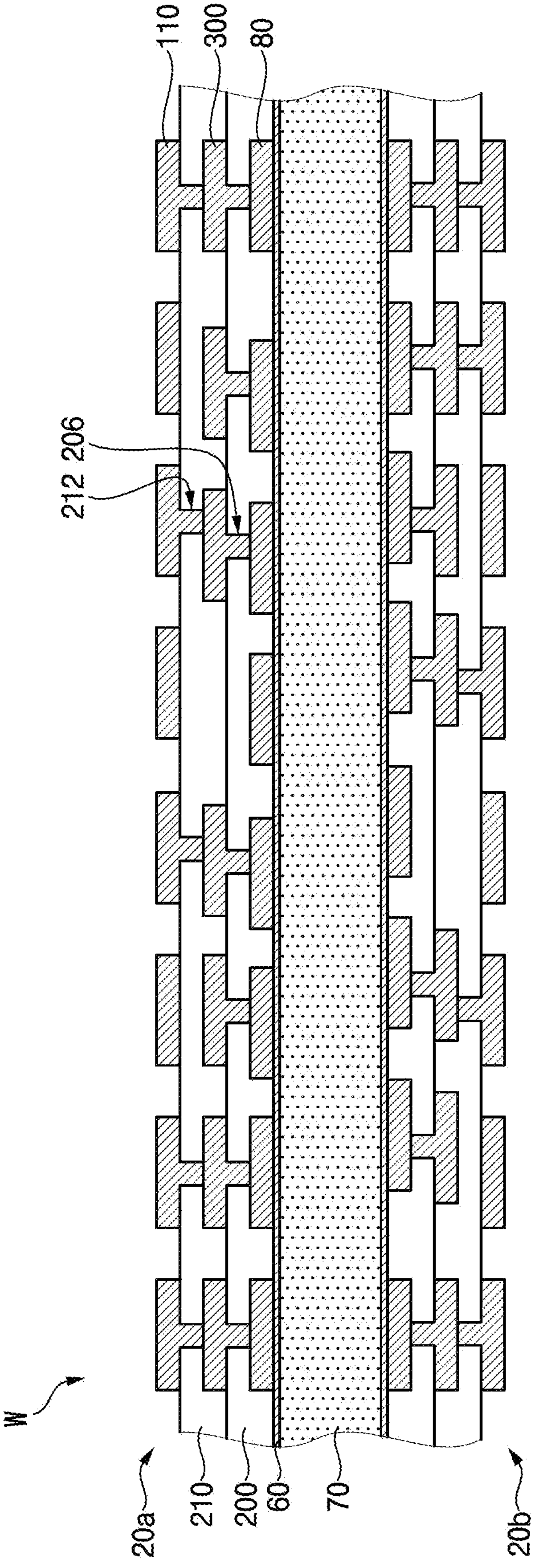
FIGS. 3, 4, 5, 6, 7, 8, 9, 10 and 11 are cross-sectional views illustrating a method of manufacturing a semiconductor package having a semiconductor substrate in accordance with example embodiments of the present inventive concept.

Referring to FIG. 3, first, a semiconductor wafer W including semi-substrates 20 that have seed layers 60 and temporary pad patterns 80 formed on the seed layers 60 may be provided.

In example embodiments of the present inventive concept, the semi-substrates 20*a* and 20*b* may be formed symmetrically with respect to a core layer 70. The semi-substrates 20*a* and 20*b* may be formed on upper and lower surfaces of the core layer 70, respectively.

In example embodiments of the present inventive concept, to form the semiconductor wafer W including the semi-substrates 20, first, the seed layer 60 and the temporary pad patterns 80 may be sequentially formed on the core layer 70. For example, the seed layer 60 may be formed on the upper surface of the core layer 70, and the temporary pad patterns 80 may be formed on the seed layer 60. The temporary pad patterns 80 may include circuit patterns that are designed to correspond to first pad patterns 100 (see FIG. 8).

The seed layer 60 may include, for example, titanium (Ti), titanium nitrogen compound (TiN), titanium oxygen compound ($TiO_2$), chromium nitrogen compound (CrN), titanium carbon nitrogen compound (TiCN), titanium aluminum nitrogen compound (TiAlN), or alloys thereof. The seed layer 60 may be formed by a sputtering process.

The temporary pad patterns 80 may include, for example, copper (Cu), aluminum (Al), tungsten (W), nickel (Ni), molybdenum (Mo), gold (Au), silver (Ag), chromium (Cr), tin (Sn), titanium (Ti) or alloys thereof. For example, the temporary pad patterns 80 may be formed by a plating process, an electroless plating process, a vapor deposition process, etc.

Then, a first insulating layer 200 having first openings 206 that expose at least portions of the temporary pad patterns 80 may be formed on the temporary pad patterns 80 and on the seed layer 60. The first insulating layer 200 may include a polymer or a dielectric layer. The first insulating layer 200 may include, for example, polyimide (PI), lead oxide (PbO), polyhydroxystyrene (PHS), or NOVOLAC. The first insulating layer 200 may be formed by a vapor deposition process, a spin coating process, etc.

Then, a plurality of redistribution wirings 300 may be formed on the first insulating layer 200 to be electrically connected to the temporary pad patterns 80 through the first openings 206. The plurality of redistribution wirings 300 may be formed by, for example, a plating process, an electroless plating process, a vapor deposition process, etc.

Then, a second insulating layer 210 having second openings 212 that expose at least portions of the redistribution wirings 300 may be formed on the first insulating layer 200. The second insulating layer 210 may include a polymer or a dielectric layer. The second insulating layer 210 may include, for example, polyimide (PI), lead oxide (PbO), polyhydroxystyrene (PHS), or NOVOLAC. The second insulating layer 210 may be formed by, for example, a vapor deposition process, a spin coating process, or the like.

Then, a plurality of second pad patterns 110 may be formed on the second insulating layer 210 to be electrically connected to the plurality of redistribution wirings 300 through the second openings 212. The plurality of second pad patterns 110 may be formed by, for example, a plating process, an electroless plating process, a vapor deposition process, etc.

Figure 4:
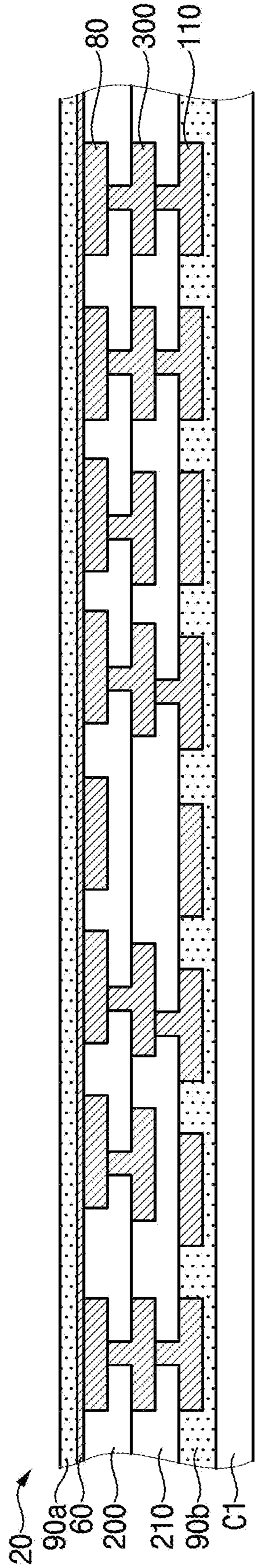
Figure 5:
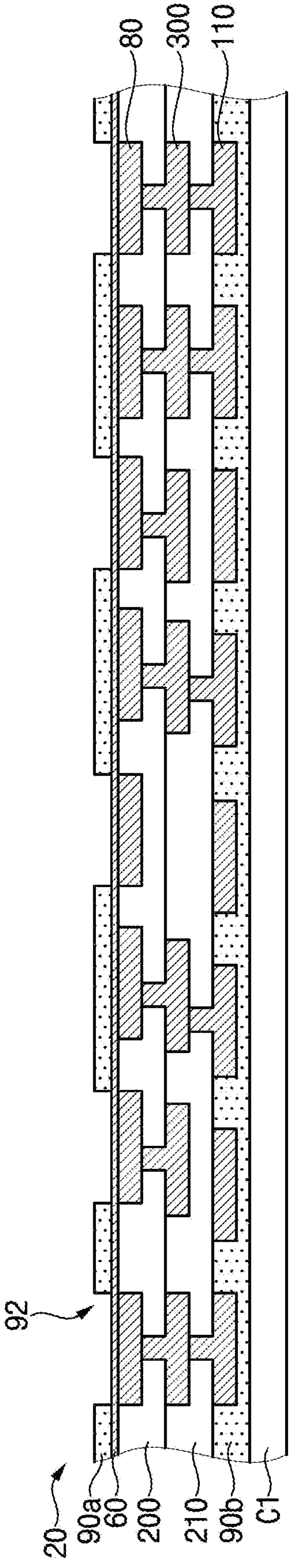

Referring to FIGS. 4 and 5, after the semi-substrate having the seed layer 60 is separated from the core layer 70, a photoresist layer 90*a* may be formed on the seed layer 60, and the photoresist layer 90*a* may be patterned to from a photoresist pattern 92 that exposes regions of the temporary pad patterns 80.

In example embodiments of the present inventive concept, first, a photoresist layer 90*b* may be formed on an upper surface of the semi-substrate 20. After a carrier substrate C1 is attached on the photoresist layer 90*b* that is formed on the upper surface of the semi-substrate 20, the structure to which the carrier substrate C1 is attached may be turned over, and the core layer 70 may be removed from a lower surface of the semi-substrate 20. The photoresist layer 90*a* may be formed on the lower surface of the semi-substrate 20 from which the core layer 70 is removed.

Then, an exposure process may be performed on the photoresist layer 90*a* to form the photoresist pattern 92 having temporary openings that expose the regions of temporary pad patterns 80.

Figure 6:
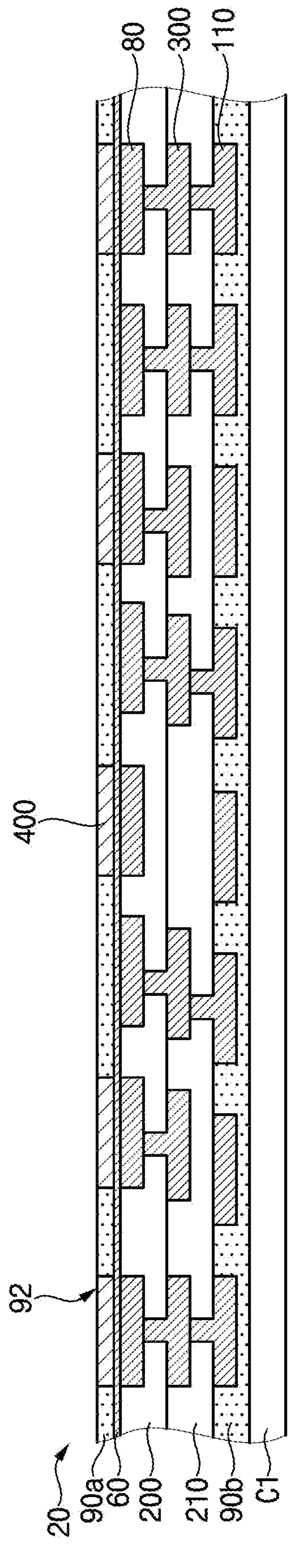

Referring to FIG. 6, a plurality of heat transfer patterns 400 may be formed in the temporary openings of the photoresist pattern 92.

In example embodiments of the present inventive concept, the plurality of heat transfer patterns 400 may be formed on the seed layer 60 in the temporary openings of the photoresist pattern 92. The plurality of heat transfer patterns 400 may be formed to extend upwardly from the seed layer 60.

Since the heat transfer patterns 400 are formed on the surface of the seed layer 60 from which the core layer 70 is removed, a process of forming an additional seed layer for forming the heat transfer patterns 400 may be unnecessary. Since the process of forming the additional seed layer is omitted, a process for forming the heat transfer patterns 400 may be simplified. Since the heat transfer patterns 400 are formed to protrude from the first insulating layer 200, the heat transfer patterns 400 may have a structure that is capable of efficiently dissipating heat.

Referring to FIGS. 7 to 9, the photoresist layer 90*a* may be removed, and at least a portion of the seed layer 60 may be removed to form first pad patterns 100 on which the heat transfer patterns 400 are formed.

In example embodiments of the present inventive concept, the at least a portion of the seed layer 60 to be removed may be a portion that is not covered by the heat transfer patterns 400, that is, exposed by the heat transfer patterns 400. The first pad patterns 100 may be formed to be bonded to the heat transfer patterns 400. The first pad patterns 100 may be formed to be electrically connected to the plurality of heat transfer patterns 400.

The first pad patterns 100 may transmit data signals, ground signals, and power signals to the heat transfer patterns 400. The first pad patterns 100 may receive data signals, ground signals, and power signals from the heat transfer patterns 400.

At least one of the heat transfer patterns 400 may be electrically connected to the plurality of redistribution wirings 300 through the first pad pattern 100. The heat transfer patterns 400, which are provided on the first pad patterns 100 that are electrically insulated from the plurality of redistribution wirings 300, may be electrically insulated.

Each of the first pad patterns 100 may have a first width W1. Each of the first pad patterns 100 may have a first thickness T1. For example, the first width W1 may be within a range of about 8 μm to about 20 μm. The first thickness T1 may be within a range of about 10 μm to about 20 μm.

Each of the heat transfer patterns 400 may have a second width W2. Each of the heat transfer patterns 400 may have a second thickness T2. For example, the second width W2 may be within a range of about 4 μm to about 16 μm. The second thickness T2 may be within a range of about 10 μm to about 20 μm.

The second width W2 the heat transfer pattern 400 may be smaller than the first width W1 of the first pad pattern 100. Because the second width W2 is smaller than the first width W1, an alignment error between the first pad patterns 100 and the heat transfer patterns 400 may be decreased during the manufacturing process. For example, a difference WD1 between the first width W1 and the second width W2 may be within a range of about 3 μm to about 5 μm.

Since the first pad patterns 100 and the heat transfer patterns 400 are formed by different processes from each other, the thicknesses of the first pad patterns 100 and the heat transfer patterns 400 may be dependent on respective processes. Since the first pad patterns 100 and the heat transfer patterns 400 are formed independently of each other, the thicknesses of the first pad patterns 100 and the heat transfer patterns 400 may be increased. The thicknesses of the first pad patterns 100 and the heat transfer patterns 400 may be finely controlled during the processes. The heat transfer patterns 400 may be bonded to the first pad patterns 100 to improve physical and electrical properties of the first pad patterns 100.

Figure 10:
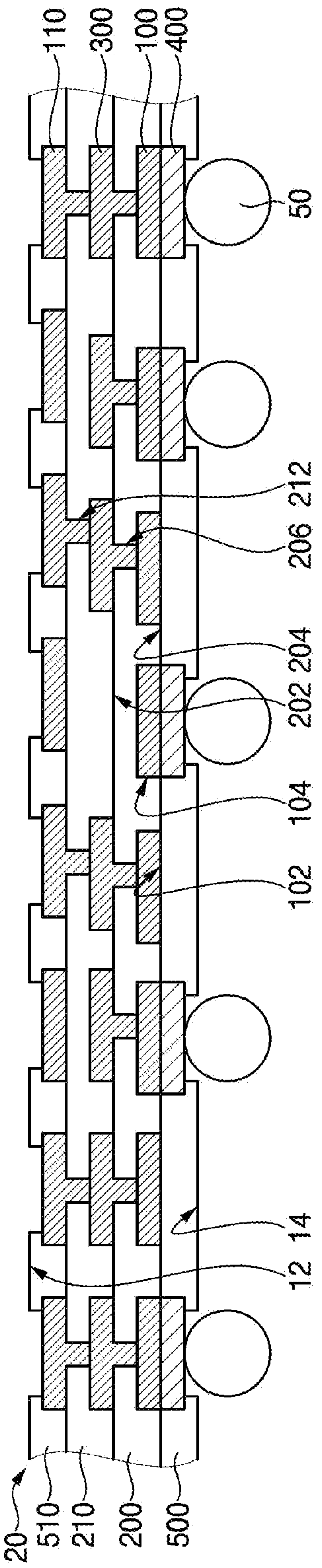
Figure 11:
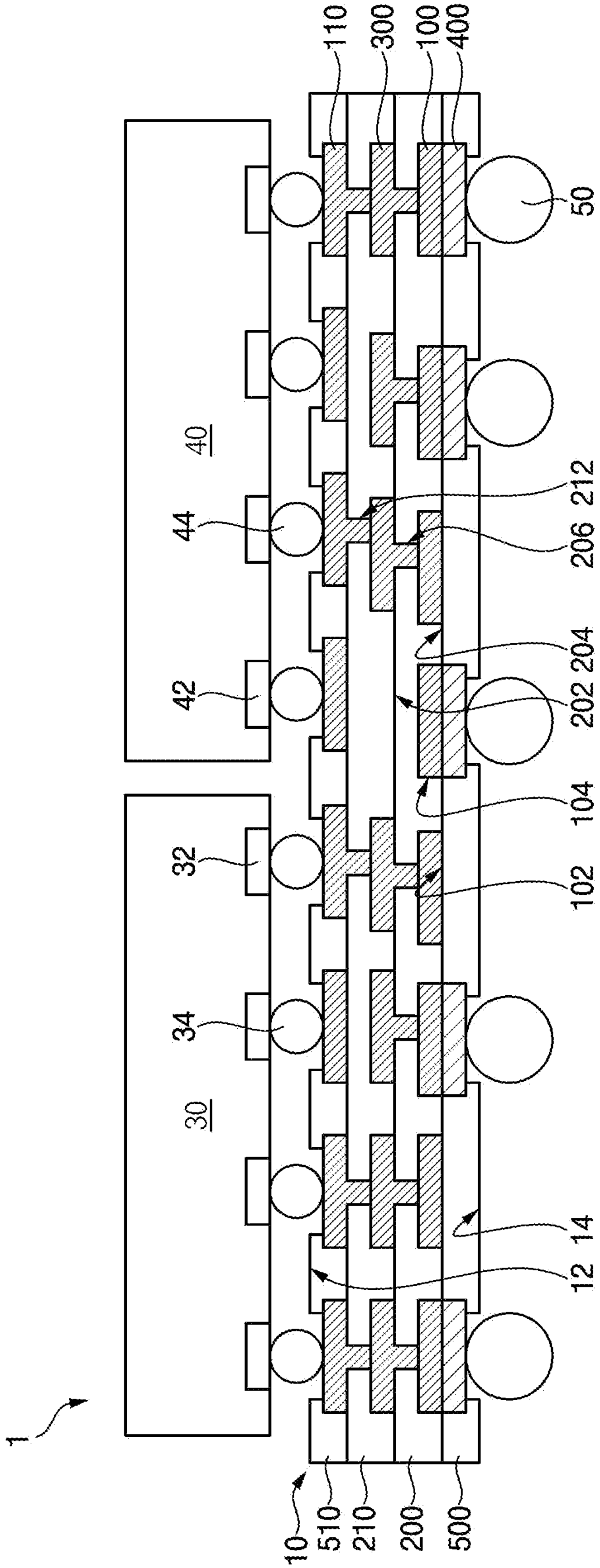

Referring to FIGS. 10 and 11, the photoresist layer 90*b* formed on the upper surface of the semi-substrate 20 may be removed, and first and second semiconductor devices 30 and 40 may be mounted on the upper surface of the semi-substrate 20. External connection bumps 50 may be formed on the heat transfer patterns 400.

In example embodiments of the present inventive concept, a first protective layer 500 may be formed on the lower surface of the semi-substrate 20, and a second protective layer 510 may be formed on the upper surface of the semi-substrate 20. The first protective layer 500 may expose at least portions of the heat transfer patterns 400. The second protective layer 510 may expose at least portions of the second pad patterns 110.

The first and second protective layers 500 and 510 may include an insulating material to protect the semi-substrate 20 from external elements and impurities. The first and second protective layers 500 and 510 may each include, for example, an oxide layer or a nitride layer. In addition, the first and second protective layers 500 and 510 may include a double layer of an oxide layer and a nitride layer. The first and second protective layers 500 and 510 may be formed of the oxide layer, for example, a silicon oxide layer ($SiO_2$) by a high-density plasma chemical vapor deposition (HDP-CVD) process.

In example embodiments of the present inventive concept, the first and second semiconductor devices 30 and 40 may be mounted on the semi-substrate 20 by a flip chip bonding method. First and second chip pads 32 and 42 of the first and second semiconductor devices 30 and 40 may be electrically connected to the second pad patterns 110 of the semi-substrate 20 through first and second conductive bumps 34 and 44. For example, the first and second conductive bumps 34 and 44 may include micro bumps (uBumps).

The external connection bumps 50 may be formed on the heat transfer patterns 400. For example, after a second photoresist pattern is formed on the lower surface of the semi-substrate 20 and second temporary openings of the second photoresist pattern are filled up with a conductive material, the second photoresist pattern may be removed and a reflow process may be performed to form the external connection bumps 50. For example, the conductive material may be formed by a plating process. In addition, the external connection bumps 50 may be formed by a screen printing method, a deposition method, a solder ball attach process, etc. For example, the external connection bumps 50 may include C4 bumps.

The semi-substrate 20 may be cut along a scribe lane region to form individual semiconductor substrates 10. The semi-substrates 20 may be cut by a sawing process.

As described above, the heat transfer patterns 400 may be formed to contact at least portions of the first pad patterns 100. Common electrical signals may be transmitted through the heat transfer patterns 400 and the first pad patterns 100, and thus, an electrical load of the first pad patterns 100 may be reduced. The heat transfer patterns 400 may contact the first pad patterns 100 to increase a cross-sectional area of an electrical path. Since the heat transfer patterns 400 increase the cross-sectional area, an amount of heat generated from the semiconductor substrate 10 may be reduced.

Since the heat transfer patterns 400 and the first pad patterns 100 are respectively formed on opposite sides of one seed layer 60, the process for forming the heat transfer patterns 400 may be simplified. Since the second width W2 of the heat transfer patterns 400 is smaller than the first width W1 of the first pad patterns 100, the alignment error between the first pad patterns 100 and the heat transfer patterns 400 may be reduced during the process.

Further, the heat transfer patterns 400 may contact and support the first pad patterns 100. Since the heat transfer patterns 400 support the first pad patterns 100, an internal supporting force of the semiconductor substrate 10 may be increased and warpage of the semiconductor substrate 10 may be prevented or reduced.

Figure 12:
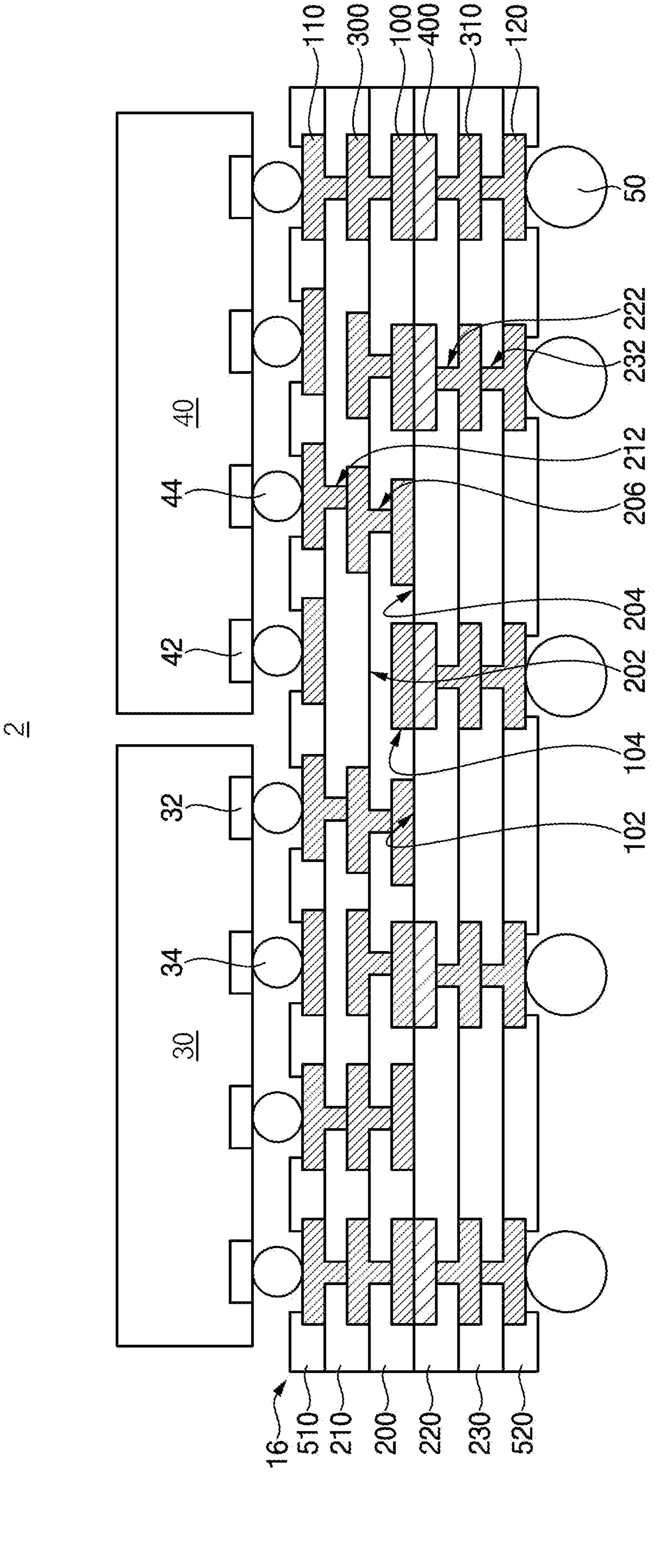
FIG. 12 is a cross-sectional view illustrating a semiconductor substrate of a semiconductor package in accordance with example embodiments of the present inventive concept.

FIG. 12 is a cross-sectional view illustrating a semiconductor substrate of a semiconductor package in accordance with example embodiments of the present inventive concept.

The semiconductor package may be substantially the same as or similar to the semiconductor package described with reference to FIGS. 1 and 2 except for additional second redistribution wirings. Thus, same or similar components are denoted by the same or similar reference numerals, and repeated descriptions of the same components will be omitted or briefly discussed.

Referring to FIG. 12, a semiconductor package 2 may include a semiconductor substrate 16, and first and second semiconductor devices 30 and 40 disposed on the semiconductor substrate 16 to be spaced apart from each other.

In example embodiments of the present inventive concept, the semiconductor substrate 16 may include a plurality of first pad patterns 100, a plurality of heat transfer patterns 400, a third insulating layer 220, and a plurality of second redistribution wirings 310. The plurality of first pad patterns 100 may be provided in a first insulating layer 200. The plurality of heat transfer patterns 400 may be provided on the first pad patterns 100. The third insulating layer 220 may be provided on the first insulating layer 200 to cover the heat transfer patterns 400, and the plurality of second redistribution wirings 310 may be provided on the third insulating layer 220 and may be electrically connected to the heat transfer patterns 400.

The first pad patterns 100 may extend in a horizontal direction in the first insulating layer 200, and the heat transfer patterns 400 may extend on the first pad patterns 100 along the extending directions of on the first pad patterns 100. The first pad patterns 100 and the heat transfer patterns 400 may constitute circuit wirings inside the semiconductor substrate 16.

The third insulating layer 220 may cover the plurality of heat transfer patterns 400. The third insulating layer 220 may have third openings 222 that expose at least portions of the plurality of heat transfer patterns 400.

The second redistribution wirings 310 may be provided on the third insulating layer 220, and may contact the plurality of heat transfer patterns 400 through the third openings 222. The second redistribution wirings 310 may be electrically connected to the plurality of heat transfer patterns 400. For example, the second redistribution wirings 310 may include copper (Cu), aluminum (Al), tungsten (W), nickel (Ni), molybdenum (Mo), gold (Au), silver (Ag), or chromium (Cr), tin (Sn), titanium (Ti) or an alloy thereof.

The semiconductor substrate 16 may further include a plurality of third pad patterns 120 and external connection bumps 50. The plurality of third pad patterns 120 may be provided on the second redistribution wirings 310, and the external connection bumps 50 may be respectively provided on the third pad patterns 120.

A fourth insulating layer 230 may cover the plurality of second redistribution wirings 310. The fourth insulating layer 230 may have fourth openings 232 that expose at least portions of the plurality of second redistribution wirings 310.

The third pad patterns 120 may be provided on the fourth insulating layer 230, and may be connected to the plurality of second redistribution wirings 310 through the fourth openings 232. For example, the third patterns 120 may contact the plurality of second redistribution wirings 310. The third pad patterns 120 may be electrically connected to the plurality of second redistribution wirings 310.

External connection bumps 50 may be formed on the third pad patterns 120. For example, the external connection bumps 50 may include C4 bumps.

The semiconductor substrate 16 may further include a third protective layer 520 provided on the fourth insulating layer 230. The third protective layer 520 may expose at least portions of the third pad patterns 120. The third protective layer 520 may include an insulating material to protect semiconductor substrate 16 from external elements or impurities. For example, the third protective layer 520 may include an oxide layer or a nitride layer. In addition, the third protective layer 520 may include a double layer of an oxide layer and a nitride layer. The third protective layer 520 may include an oxide layer, for example, a silicon oxide film ($SiO_2$) by a high-density plasma chemical vapor deposition (HDP-CVD) process.

Hereinafter, a method of manufacturing the semiconductor package in FIG. 12 will be described.

FIGS. 13 to 17 are cross-sectional views illustrating a method of manufacturing a semiconductor package having a semiconductor substrate in accordance with example embodiments of the present inventive concept.

Figure 13:
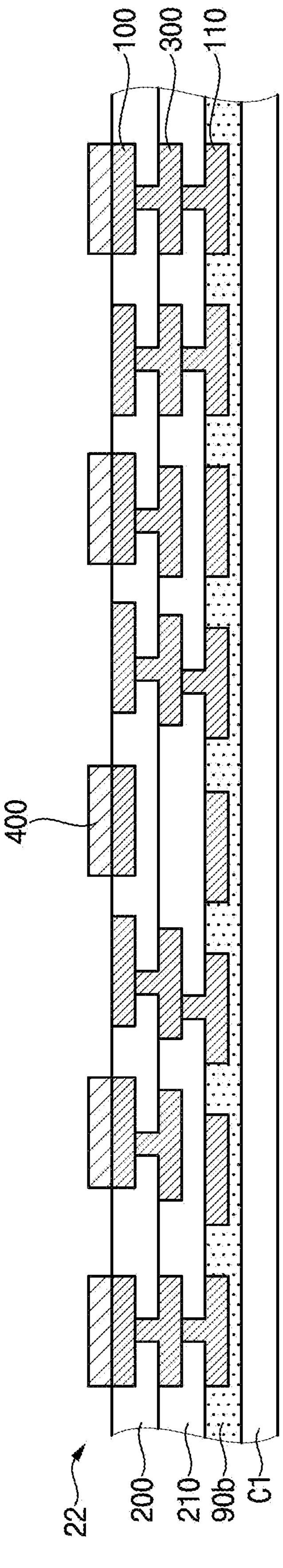
FIGS. 13, 14, 15, 16 and 17 are cross-sectional views illustrating a method of manufacturing a semiconductor package having a semiconductor substrate in accordance with example embodiments of the present inventive concept.

Referring to FIG. 13, first, processes the same as or similar to the processes described with reference to FIGS. 3 to 9 may be performed to form a semi-substrate 22 including first pad patterns 100, second pad patterns 110, a first insulating layer 200, a second insulating layer 210, and heat transfer patterns 400.

Figure 14:
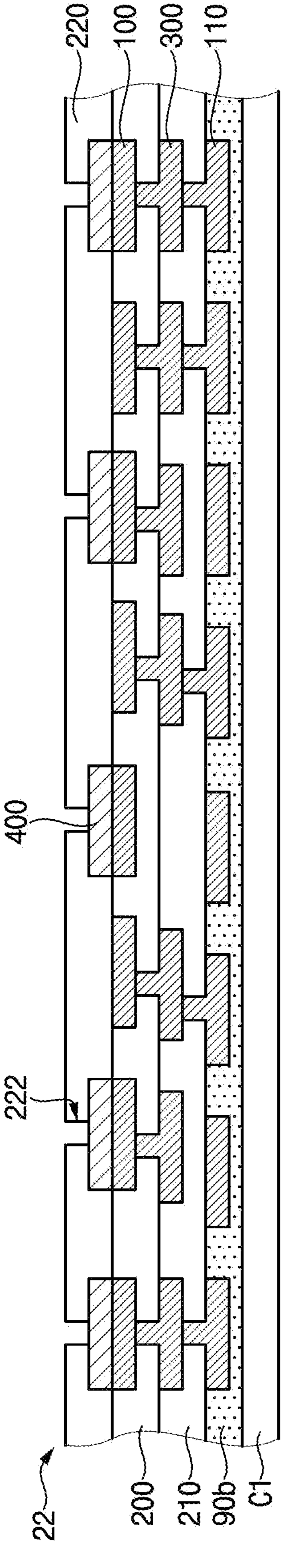

Referring to FIG. 14, a third insulating layer 220 having third openings 222 that expose at least portions of the heat transfer patterns 400 may be formed on the first insulating layer 200. The third insulating layer 220 may include a polymer or a dielectric layer. The third insulating layer 220 may include, for example, polyimide (PI), lead oxide (PbO), polyhydroxystyrene (PHS), novolac, or the like. The third insulating layer 220 may be formed by a vapor deposition process, a spin coating process, etc.

Figure 15:
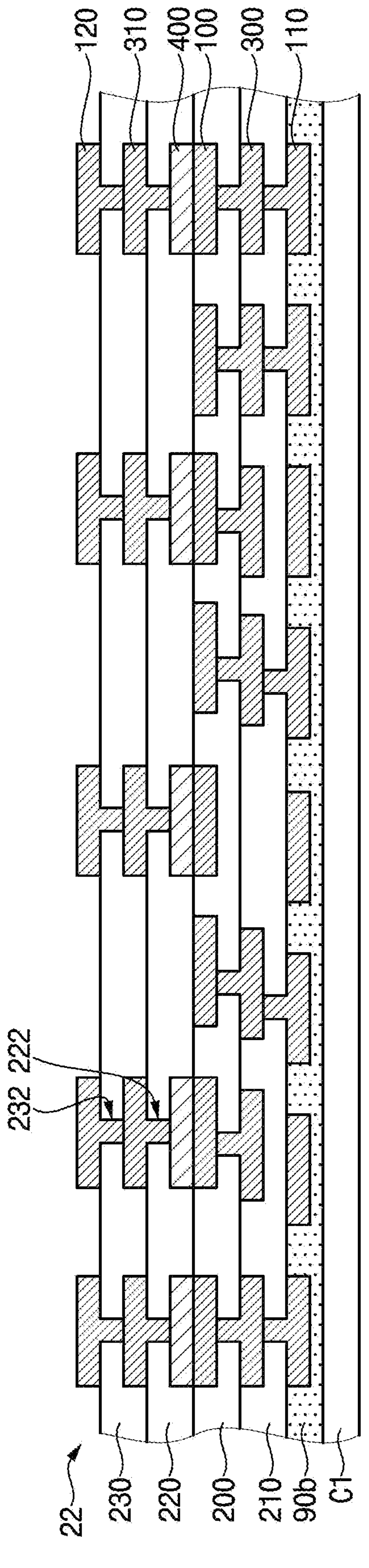

Referring to FIG. 15, a plurality of second redistribution wirings 310 may be formed on the third insulating layer 220 and may be electrically connected to the heat transfer patterns 400 through the third openings 222.

Then, a fourth insulating layer 230 having fourth openings 232 that expose at least portions of the second redistribution wirings 310 may be formed on the third insulating layer 220.

Then, a plurality of third pad patterns 120 may be formed on the fourth insulating layer 230 and may be electrically connected to the second redistribution wirings 310 through the fourth openings 232.

Figure 16:
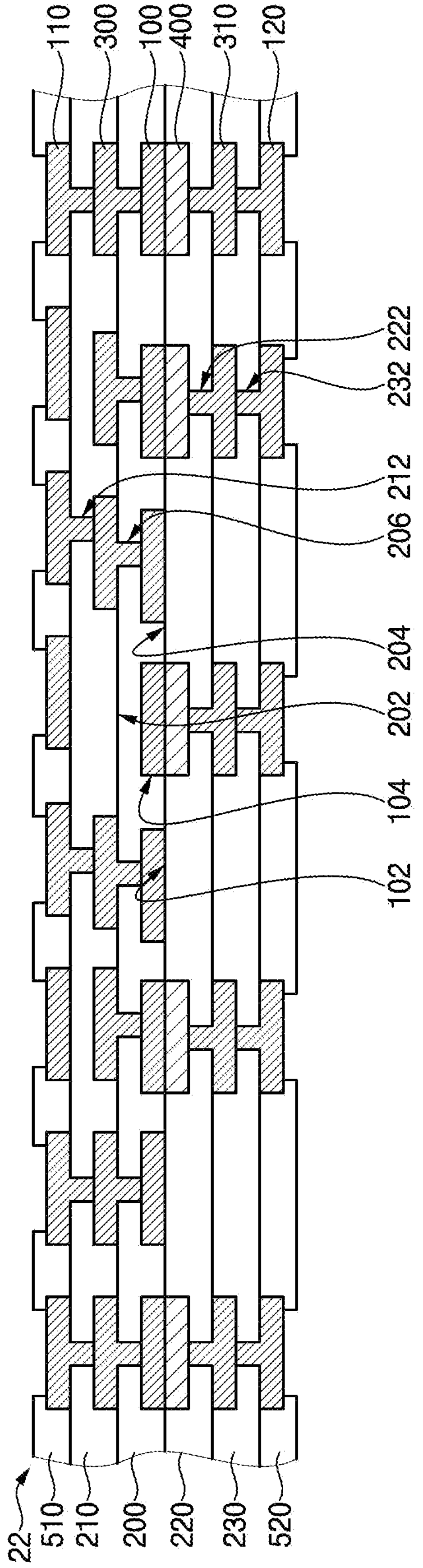

Referring to FIG. 16, a third protective layer 520 may be formed on the third insulating layer 220. The third protective layer 520 may expose at least portions of the third pad patterns 120.

Figure 17:
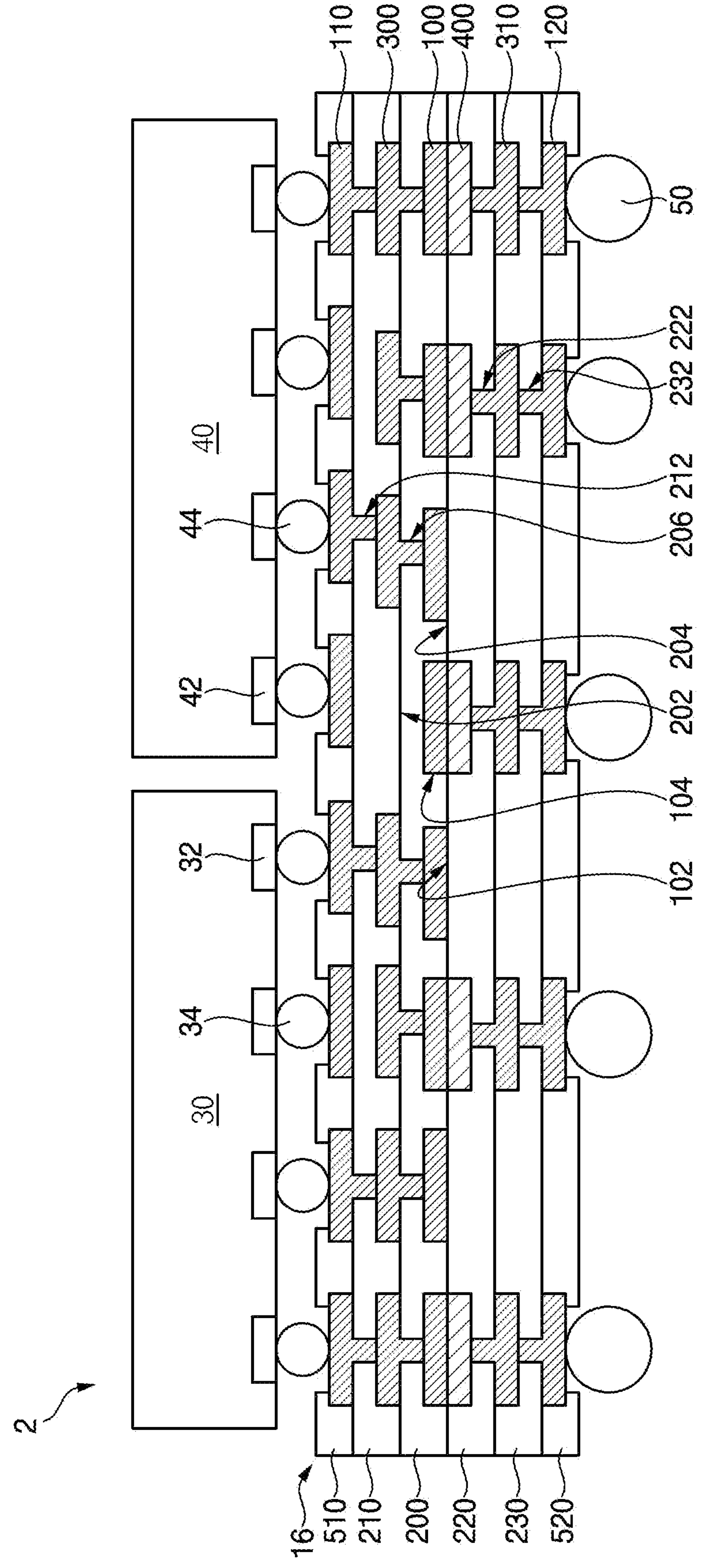

Referring to FIG. 17, the semi-substrate 22 may be cut along a scribe lane region to form individual semiconductor substrates 16. The semi-substrate 22 may be cut by, for example, a sawing process.

Then, first and second semiconductor devices 30 and 40 may be mounted on the semiconductor substrate 16 by a flip chip bonding method. First and second chip pads 32 and 42 of the first and second semiconductor devices 30 and 40 may be electrically connected to the second pad patterns 110 of the semiconductor substrate 16 via first and second conductive bumps 34 and 44. For example, the first and second conductive bumps 34 and 44 may include micro bumps (uBumps).

External connection bumps 50 may be formed on the third pad patterns 120. For example, after a third photoresist pattern is formed on a lower surface of the semi-substrate 22 and third temporary opening of the third photoresist pattern are filled up with a conductive material, the third photoresist pattern may be removed and a reflow process may be performed to form the external connection bumps 50. For example, the conductive material may be formed by a plating process. In addition, the external connection bumps 50 may be formed by, for example, a screen printing method, a deposition method, etc. For example, the external connection bumps 50 may include C4 bumps.

Figure 18:
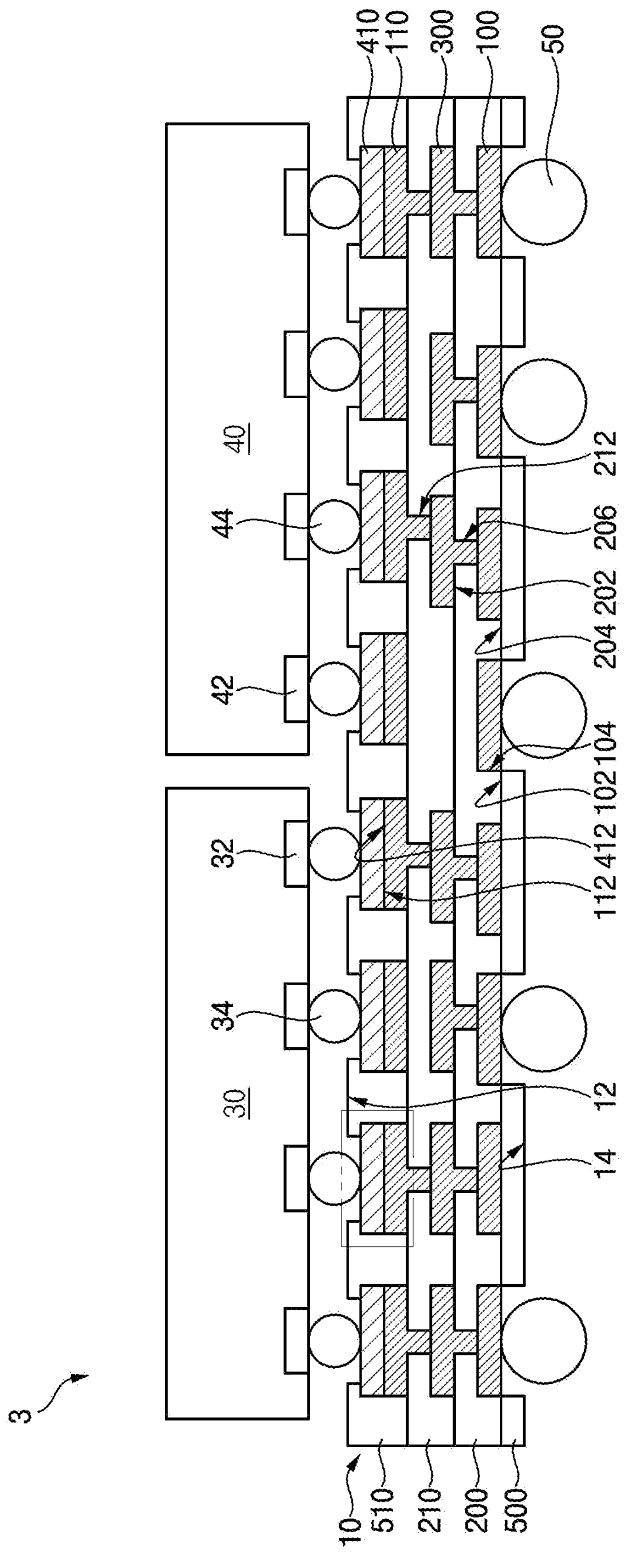
FIG. 18 is a cross-sectional view illustrating a semiconductor substrate of a semiconductor package in accordance with example embodiments of the present inventive concept.
Figure 19:
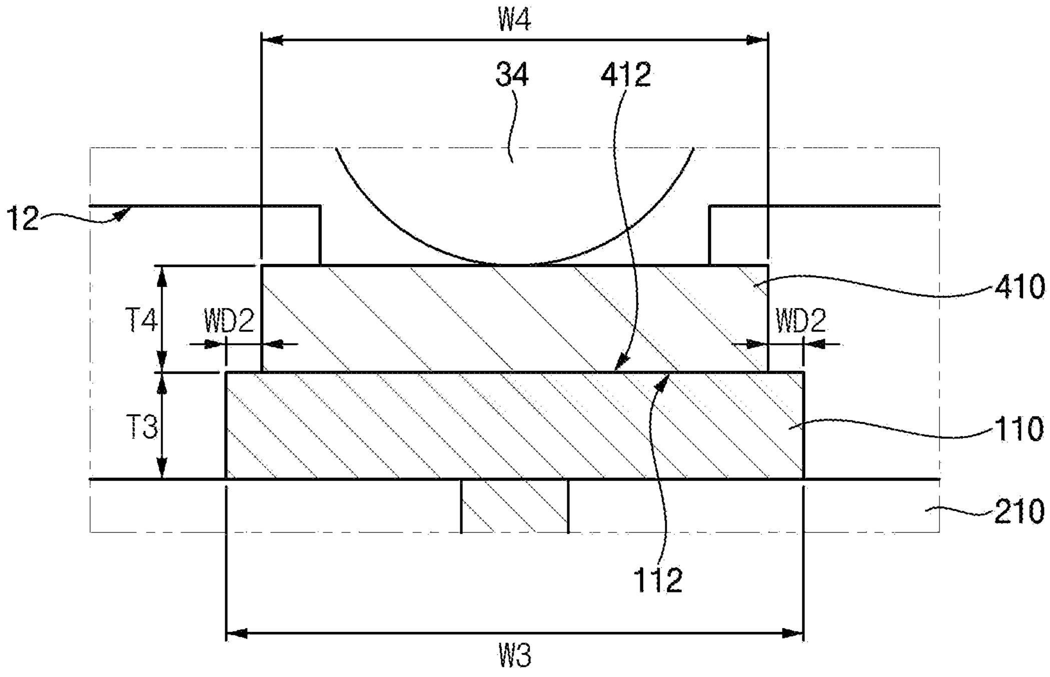
FIG. 19 is an enlarged cross-sectional view illustrating portion 'C' in FIG. 18.

FIG. 18 is a cross-sectional view illustrating a semiconductor substrate of a semiconductor package in accordance with example embodiments of the present inventive concept. FIG. 19 is an enlarged cross-sectional view illustrating portion 'C' in FIG. 18. The semiconductor package may be substantially the same as or similar to the semiconductor package described with reference to FIGS. 1 and 2 except for configurations of heat transfer patterns. Thus, same or similar components are denoted by the same or similar reference numerals, and repeated descriptions of the same components will be omitted or briefly discussed.

Referring to FIGS. 18 and 19, a semiconductor package 3 may include a semiconductor substrate 10, and first and second semiconductor devices 30 and 40 disposed on the semiconductor substrate 10 to be spaced apart from each other.

In example embodiments of the present inventive concept, the semiconductor substrate 10 may include a plurality of first pad patterns 100, a first insulating layer 200, a plurality of redistribution wirings 300, a second insulating layer 210, a plurality of second pad patterns 110, and a plurality of second heat transfer patterns 410. The first insulating layer 200 may cover the plurality of first pad patterns 100. The plurality of redistribution wirings 300 may be provided on the first insulating layer 200 and may be electrically connected to the first pad patterns 100. A second insulating layer 210 may be provided on the first insulating layer 200 to cover the plurality of redistribution wirings 300. A plurality of second pad patterns 110 may be provided on the second insulating layer 210 and may be electrically connected to the plurality of redistribution wirings 300, and the plurality of second heat transfer patterns 410 may be provided on the second pad patterns 110.

The second pad patterns 110 may be provided on the second insulating layer 210, and may contact the plurality of redistribution wirings 300 through second openings 212. Each of the second pad patterns 110 may have a third width W3. Each of the second pad patterns 110 may have a third thickness T3. For example, the third width W3 may be within a range of about 4 μm to about 16 μm. The third thickness T3 may be within a range of about 10 μm to about 20 μm.

The plurality of second heat transfer patterns 410 may be provided on at least portions of the second pad patterns 110. The plurality of second heat transfer patterns 410 may be disposed on an upper surface 112 of the second pad patterns 110. Heat from the second pad patterns 110 may be transferred to the plurality of second heat transfer patterns 410. For example, the plurality of second heat transfer patterns 410 may contact the second pad patterns 110. Since the plurality of second heat transfer patterns 410 are disposed on the second pad patterns 110, the heat from the second pad patterns 110 may be efficiently dissipated.

Lower surfaces 412 of the plurality of second heat transfer patterns 410 may be bonded to the upper surfaces 112 of the second pad patterns 110, respectively. The plurality of second heat transfer patterns 410 may be electrically connected to the second pad patterns 110. The second heat transfer patterns 410 may transfer data signals, ground signals, and power signals to the second pad patterns 110. The second heat transfer patterns 410 may receive data signals, ground signals, and power signals from the second pad patterns 110.

At least one of the second heat transfer patterns 410 may be electrically connected to the plurality of redistribution wirings 300 through the second pad patterns 110. The second heat transfer patterns 410, which are provided on the second pad patterns 110 that are electrically insulated from the plurality of redistribution wirings 300, may be electrically insulated.

Each of the second heat transfer patterns 410 may have a fourth width W4. Each of the second heat transfer patterns 410 may have a fourth thickness T4. For example, the fourth width W4 may be within a range of about 4 μm to about 16 μm. The fourth thickness T4 may be within a range of about 10 μm to about 20 μm.

The fourth width W4 may be smaller than the third width W3 of the second pad patterns 110. Since the fourth width W4 is smaller than the third width W3, alignment errors between the second pad patterns 110 and the second heat transfer patterns 410 may be reduced during the process. For example, a difference WD2 between the third width W3 and the fourth width W4 may be within a range of about 3 μm to about 5 μm.

The second heat transfer patterns 410 may be formed on the second pad patterns 110 by performing processes identical to or similar to the processes described with reference to FIGS. 3 to 9.

In example embodiments of the present inventive concept, the semiconductor substrate 10 may further include a first protective layer 500 provided on the first insulating layer 200, and a second protective layer 510 provided on the second insulating layer 210. The second protective layer 510 may be provided on the second insulating layer 210 and may expose at least portions of the second heat transfer patterns 410.

The first and second semiconductor devices 30 and 40 may be mounted on the semiconductor substrate 10 by a flip chip bonding method. The first and second semiconductor devices 30 and 40 may be attached to the semiconductor substrate 10 by a thermal compression process.

The first semiconductor device 30 may be bonded to at least portions of the second heat transfer patterns 410 via first conductive bumps 34 that are provided on first chip pads 32 of the first semiconductor device 30. The second semiconductor device 40 may be bonded to at least portions of the second heat transfer patterns 410 via second conductive bumps 44 that are provided on second chip pads 42 of the second semiconductor device 40. The first and second semiconductor devices 30 and 40 may be electrically connected to each other through the second pad patterns 110, the redistribution wirings 300, and the second heat transfer patterns 410 of the semiconductor substrate 10.

While the present inventive concept has been described with reference to example embodiments thereof, it will be understood by those of ordinary skill in the art that various changes in form and details may be made thereto without departing from the spirit and scope of the present inventive concept.

What is claimed is:

1. A semiconductor substrate, comprising:

a plurality of first pad patterns;

a first insulating layer having a first surface and a second surface opposite to each other, wherein the first insulating layer covers side surfaces of the plurality of first pad patterns such that lower surfaces of the plurality of first pad patterns are exposed by the second surface of the first insulating layer, wherein the first insulating layer has first openings that expose at least portions of upper surfaces of the plurality of first pad patterns;

a plurality of redistribution wirings on the first surface of the first insulating layer;

a second insulating layer covering the plurality of redistribution wirings, wherein the second insulating layer has second openings that expose at least portions of the plurality of redistribution wirings;

a plurality of second pad patterns on the second insulating layer;

a plurality of heat transfer patterns on the plurality of first pad patterns; and a first protective layer disposed on the second surface of the first insulating layer and exposing at least portions of the plurality of heat transfer patterns, wherein the first protective layer covers lower surfaces of the plurality of heat transfer patterns.

2. The semiconductor substrate of claim 1, further comprising:

a second protective layer on the second insulating layer to expose at least portions of the plurality of second pad patterns.

3. The semiconductor substrate of claim 1, further comprising:

a third insulating layer on the second surface of the first insulating layer and having third openings that expose at least portions of the plurality of heat transfer patterns; and a plurality of second redistribution wirings on the third insulating layer.

4. The semiconductor substrate of claim 3, further comprising:

a plurality of third pad patterns on the plurality of second redistribution wirings; and a plurality of external connection bumps on the plurality of third pad patterns, respectively.

5. The semiconductor substrate of claim 1, wherein each of the plurality of first pad patterns has a first width, and each of the plurality of heat transfer patterns has a second width that is smaller than the first width.

6. The semiconductor substrate of claim 5, wherein a difference between the first width and the second width is within a range of 3 μm to 5 μm.

7. The semiconductor substrate of claim 5, wherein each of the plurality of first pad patterns has a first thickness, wherein each of the plurality of heat transfer patterns has a second thickness, wherein the first thickness is within a range of 10 μm to 20 μm, and the second thickness is within a range of 10 μm to 20 μm.

8. The semiconductor substrate of claim 1, wherein the plurality of heat transfer patterns transmit at least one of a data signal, a ground signal, or a power signal to the first pad patterns.

9. The semiconductor substrate of claim 1, wherein each of the plurality of heat transfer patterns includes at least one of a signal pattern, a land pattern, a ball pattern, or a dummy pattern.

10. The semiconductor substrate of claim 1, further comprising:

a plurality of second heat transfer patterns on the plurality of second pad patterns, respectively.

11. A semiconductor substrate, comprising:

a plurality of first pad patterns;

a first insulating layer covering the plurality of first pad patterns, wherein the first insulating layer has first openings that expose at least portions of upper surfaces of the plurality of first pad patterns;

a plurality of redistribution wirings on an upper surface of the first insulating layer;

a second insulating layer on the first insulating layer, wherein the second insulating layer covers the plurality of redistribution wirings, wherein the second insulating layer has second openings that expose at least portions of the plurality of redistribution wirings;

a plurality of second pad patterns on the second insulating layer;

a plurality of first heat transfer patterns on the plurality of first pad patterns;

a plurality of second heat transfer patterns on the plurality of second pad patterns;

a third insulating layer on a lower surface of the first insulating layer and having third openings that expose at least portions of the plurality of first heat transfer patterns; and a plurality of second redistribution wirings on the third insulating layer.

12. The semiconductor substrate of claim 11, further comprising:

a protective layer on an upper surface the second insulating layer to expose at least portions of the plurality of second heat transfer patterns.

13. The semiconductor substrate of claim 11, further comprising:

a plurality of third pad patterns on the plurality of second redistribution wirings; and a plurality of external connection bumps on the plurality of third pad patterns, respectively.

14. The semiconductor substrate of claim 11, wherein each of the plurality of first pad patterns has a first width, and each of the plurality of first heat transfer patterns has a second width that is smaller than the first width.

15. The semiconductor substrate of claim 14, wherein a difference between the first width and the second width is within a range of 3 μm to 5 μm.

16. The semiconductor substrate of claim 14, wherein each of the first pad patterns has a first thickness, wherein each of the plurality of first heat transfer patterns has a second thickness, wherein the first thickness is within a range of 10 μm to 20 μm, and the second thickness is within a range of 10 μm to 20 μm.

17. The semiconductor substrate of claim 11, wherein the plurality of first heat transfer patterns transmit at least one of a data signal, a ground signal, or a power signal to the first pad patterns.

18. The semiconductor substrate of claim 11, wherein each of the plurality of first heat transfer patterns includes at least one of a signal pattern, a land pattern, a ball pattern, or a dummy pattern.

19. A semiconductor substrate, comprising:

a plurality of first pad patterns;

a first insulating layer having a first surface and a second surface opposite to each other, wherein the first insulating layer covers side surfaces of the plurality of first pad patterns such that lower surfaces of the plurality of first pad patterns are exposed from the second surface of the first insulating layer, wherein the first insulating layer has first openings that expose at least portions of upper surfaces of the plurality of first pad patterns;

a plurality of redistribution wirings on the first surface of the first insulating layer;

a second insulating layer covering the plurality of redistribution wirings and having second openings that expose at least portions of the plurality of redistribution wirings;

a plurality of second pad patterns on the second insulating layer;

a plurality of heat transfer patterns on the lower surfaces of the plurality of first pad patterns and protruding beyond the second surface of the first insulating layer;

a third insulating layer on the second surface of the first insulating layer and having third openings that expose at least portions of the plurality of heat transfer patterns;

a plurality of second redistribution wirings on the third insulating layer;

a first protective layer on the second insulating layer and exposing at least portions of the plurality of second pad patterns; and a second protective layer on the third insulating layer, wherein each of the plurality of first pad patterns has a first width, and each of the plurality of heat transfer patterns has a second width that is less than the first width, and a difference between the first width and the second width is within a range of 3 μm to 5 μm.

* * * * *